United States Patent [19]
Reiter

[11] 4,015,141
[45] Mar. 29, 1977

[54] APPARATUS FOR COMPARING VOLTAGES

[75] Inventor: Herbert Reiter, Munich, Germany

[73] Assignee: Siemens Aktiengesellschaft, Munich, Germany

[22] Filed: Dec. 4, 1974

[21] Appl. No.: 529,496

[30] Foreign Application Priority Data

Dec. 4, 1973 Germany .................. 2360364

[52] U.S. Cl. .............. 307/235 N; 307/235 V; 328/148; 328/150

[51] Int. Cl.² .................. H03K 5/153; H03K 5/08

[58] Field of Search ....... 307/235 N, 235 T, 235 V, 307/237; 328/146, 147, 148, 150

[56] References Cited

UNITED STATES PATENTS

| | | |
|---|---|---|
| 3,309,531 | 3/1967 | Hearn et al. .................. 307/216 |
| 3,354,448 | 11/1967 | Brolin .................. 307/235 X |
| 3,515,899 | 6/1970 | May .................. 307/214 X |
| 3,553,491 | 1/1971 | Schulz .................. 307/235 |
| 3,679,912 | 7/1972 | Tenenbaum .................. 307/235 |
| 3,725,795 | 4/1973 | Mesenhimer .................. 307/235 X |
| 3,733,498 | 5/1973 | Watson .................. 307/235 X |
| 3,789,242 | 1/1974 | Cantor .................. 307/235 |
| 3,806,915 | 4/1974 | Higgins et al. .................. 307/235 X |

Primary Examiner—John S. Heyman
Assistant Examiner—Larry N. Anagnos
Attorney, Agent, or Firm—Gerald L. Lett

[57] ABSTRACT

Apparatus for comparing voltages with predetermined upper and lower threshold levels is described. A single differential circuit is connected to a junction point in a first voltage divider, which determines one of the above threshold levels. The differential circuit produces a first output signal level when that threshold value is exceeded. A transistor is connected to a junction point of a second voltage divider, which determines the other threshold level, as to have its conducting state controlled thereby. The transistor is rendered conductive when the other threshold level is exceeded switching the output signal.

2 Claims, 3 Drawing Figures

APPARATUS FOR COMPARING VOLTAGES

BACKGROUND OF THE INVENTION

This invention relates to apparatus for comparing voltages with lower and upper thresholds that can be set in first and second voltage divider circuits.

A common technique for comparing voltages with a reference voltage uses differential circuits by which one can determine if a voltage exceeds or falls below a predetermined reference voltage level. The mode of operation for such circuits generally comprises weighting the difference between the input voltage being compared and the fixed reference voltage. If the difference runs through zero, a transistor stage is switched. In this case, a specified output signal is provided over an output stage.

Frequently, a voltage must be compared not with one but with two reference values. This problem arises if, by way of example, an input voltage is to be monitored with respect to dropping below a lower or exceeding an upper threshold. Assuming that as a result of the connection of a differential circuit to the dividing point of a voltage divider circuit, to which the input voltage being compared is applied, the various thresholds can be set through appropriate adjustments of the resistance values, the above problem can be solved by providing two differential circuits, each connected to the dividing point of a first and second voltage divider circuit. The output signals of the two differential circuits then can be logically interconnected in such a manner that a specified output signal is continually available, if the input voltage lies within the range defined by the lower and upper thresholds. However, due to the doubling and linking of the output signals, such an arrangement results in a relatively vast amount of circuitry.

An object of the invention, therefore, is to provide a circuit arrangement for comparing a voltage with an upper and a lower threshold, by which the expense for circuitry required heretofore is reduced.

SUMMARY OF THE INVENTION

In accordance with the invention, the foregoing and other objects are achieved in that there is connected to the dividing point of a first voltage divider circuit a differential circuit of known construction which, when the lower threshold is exceeded, provides an output signal (SA=1), a transistor stage is connected to the dividing point of a second voltage divider circuit which, when the upper threshold is exceeded, is switched to the conducting state, and the output signal is switched off (SA=0). A diode is provided limiting the voltage at the dividing point of the first voltage divider circuit.

The circuit arrangement constructed according to the invention needs only a single differential circuit of known construction. Instead of the second such circuit needed in comparator devices of known construction, the circuit arrangement according to the invention contains only one additional transistor and one diode. Since the circuit arrangement according to the invention has only one output, at which a specified output signal is available, the linkage of two output signals necessary in arrangements of known construction and, thereby, the amount of circuitry connected therewith is no longer necessary.

BRIEF DESCRIPTION OF THE DRAWINGS

The principles of the invention will be more readily understood by reference to the description of a preferred embodiment given hereinbelow in conjunction with the accompanying drawing, wherein.

DETAILED DESCRIPTION OF THE DRAWINGS

Figure 1:
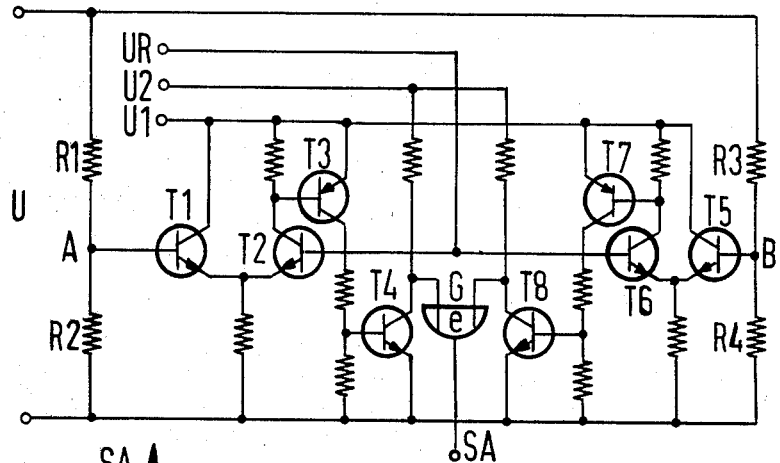
FIG. 1 is a schematic diagram of a comparator means of known construction employing two differential circuits.

The circuit arrangement shown in FIG. 1 comprises a first differential circuit in which the transistors T1 and T2 form a transistor stage connected to the junction point A of a first voltage divider circuit (R1 and R2), and the transistors T3 and T4 form an output stage. In the second differential circuit the transistors T5 and T6 form a transistor stage connected to the junction point B of a second voltage divider circuit (R3 and R4), and the transistors T7 and T8 form the output stage. The input voltage U is applied both to the first and second voltage divider circuits. The auxiliary voltages U1 and U2, as well as a set of resistors (not shown in detail) are provided for the power supply of the differential circuits. The reference voltage source UR is connected to the transistor stages T1, T2 or T5, T6 of the two differential circuits. When the lower or the upper threshold is exceeded, each threshold being set to the junction points A and B, output signals are provided which are interconnected by means of a logic circuit (in the preferred embodiment by an exclusive-OR gate G) over the output transistors T3 and T4 of the left differential circuit or T7 and T8 of the right differential circuit.

Assuming that the lower level is labeled 0 and the upper level 1, the mode of operation of the circuit of FIG. 1 is as follows:

As long as the input voltage U is lower than the preset threshold, the transistor T1 in the left differential circuit and the transistor T5 in the right differential circuit are turned off. The transistor T2 and, through it, also the output transistors T3 and T4, as well as the transistor T6 and, through it, the transistors T7 and T8, are then rendered conductive. In this case, a zero is applied to both inputs of the gate G, so that an output signal SA is provided in the form of a zero level. If the input voltage U exceeds the preset lower threshold, i.e., if the voltage at the junction point A is higher than the reference voltage UR, the transistor T1 is rendered conductive, as a result of which the transistor T2 and, through it, the output transistors T3 and T4 of the left differential circuit are turned off.

As long as the input voltage U is lower than the upper threshold, i.e., as long as the voltage at the junction point B is lower than the reference voltage, the conditions described above will remain unchanged (The transistors T6, T7 and T8 are in the conducting state.). During this phase, the one signal is applied at the left input of the gate G, and the zero signal is applied at the right input. Thus, the exclusive-OR gate G provides the output signal SA=1.

If the input voltage U exceeds the preset upper threshold, i.e., if the voltage to be set at the junction point B is higher than the reference voltage UR, the transistor T5 in the right differential circuit is rendered conductive and the transistors T6, T7 and T8 are turned off. As a result both inputs of the gate G are driven by a one signal, and this leads to the generation of the output signal SA=0.

Figure 2:
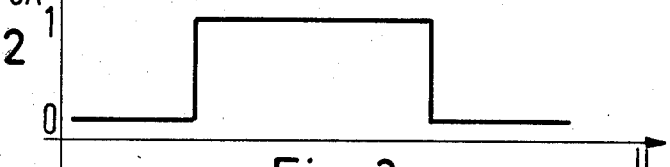
FIG. 2 shows the output signal of the comparator means of FIG. 1.

Thus, the characteristic curve of the output signal SA, shown in FIG. 2 is obtained, which has the value SA=1 only within a specific voltage range.

Figure 3:
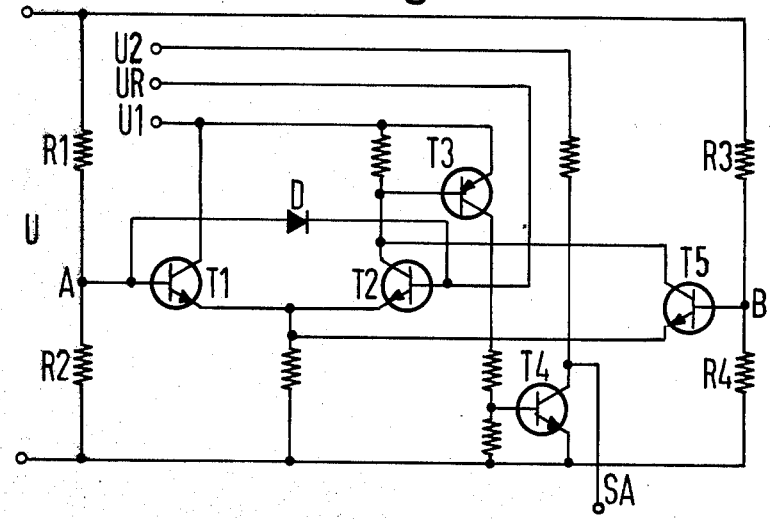
FIG. 3 is a schematic diagram of a preferred embodiment constructed according to the invention.

The preferred embodiment of the invention shown in FIG. 3 comprises only one differential signal with transistors T1 and T2, as well as output transistors T3 and T4. The differential circuit is connected to a junction point A of a first voltage divider circuit (R1 and R2). The junction point B of the second voltage divider circuit (R3 and R4) is only connected to the base of a transistor T5. Moreover, a diode D is connected between the junction point A and the reference voltage UR. The output signal SA is connected directly to the collector of output transistor T4. The auxiliary voltages U1 and U2, as well as a set of resistors not shown in detail herein, are again available for the power supply of the circuit. The reference voltage source UR is connected to the differential circuit.

This circuit arrangement operates as follows:

As long as the input voltage U has a value whereby neither the threshold set at the junction point A of the first voltage divider circuit (R1, R2) nor the threshold set at the junction point B of the second voltage divider circuit (R3, R4) is exceeded, the transistor T1 of the differential circuit remains turned off, while the transistors T2, T3 and T4 are conductive. The transistor T5 is turned off. The output signal SA thus corresponds to the logic value 0.

If the input voltage U exceeds the lower threshold, i.e., if the voltage at the junction point A is higher than the reference voltage UR, the transistor T1 is rendered conductive, as a result of which the transistors T2, T3 and T4 are turned off. During this phase, the transistor T5 remains turned off. The output signal SA=1 is provided with the change of the output transistor T4 from the conducting to the turned-off state.

If with rising input voltage U the upper threshold set at the junction point B is likewise exceeded, the transistor T5 will be switched to the conducting state. This reversal can take place, because diode D limits the potential at the junction point A of the first voltage divider circuit (R1, R2) to a specific value. As a result, the potential at the junction point of the emitters of the transistors T1 and T2 in the differential circuit and of transistor T5 is maintained at the level of the reference voltage UR.

In the preferred embodiment this is achieved by connecting the diode D between the dividing point A and the reference voltage UR, although the invention is by no means restricted to this special connection. The control of the differential circuit and, thereby, the control of the output transistors T3 and T4 is now taken over by the transistor T5. As soon as the latter is switched to the conducting state, which is the case when the upper threshold set at the junction point B is exceeded, the output transistors T3 and T4 are again rendered conductive and the output signal is switched off (SA=0). Thus, the output signal SA corresponds to the characteristic curve shown in FIG. 2.

The principles of the invention are described hereinabove in terms of a preferred embodiment, which is to be considered exemplary. It is contemplated that the described embodiment can be modified or changed in a variety of ways while remaining within the scope of the invention as defined by the appended claims.

I claim:

1. Apparatus for indicating when an input voltage reaches predetermined lower and upper threshold voltage levels comprising:
    differential comparator circuit means,
    a reference voltage source coupled to a first input of said differential comparator circuit means,
    first voltage divider means connected across terminals for said input voltage and having a first junction point therein connected to a second input of said differential comparator circuit means,
    said first voltage divider being constructed to produce an output exceeding the value of the output of said reference voltage source when said input voltage reaches said lower threshold level,
    a transistor output stage, the conductive state of which is changed for producing an output signal having a first value when said lower threshold level at said first voltage divider exceeds the voltage level of said reference voltage source,
    second voltage divider means connected across the terminals for said input voltage and having a second junction point therein,
    said second voltage divider being constructed to produce an output voltage exceeding the reference voltage level when the said input voltage reaches said upper threshold level and
    switching means coupled to said second junction point as to have its conductive state changed when said upper threshold level appears at said second voltage divider,
    said switching means being coupled to said transistor output stage, the conductive state of which is changed for producing an output signal having a second level when said switching means has changed its conductive state.

2. The apparatus defined in claim 1, further comprising:
    voltage limiting means connected between said first and second inputs of said differential comparator circuit means for limiting the voltage appearing at said first junction point to a fixed value.

* * * * *